United States Patent
Kumar et al.

(10) Patent No.: US 9,250,696 B2
(45) Date of Patent: Feb. 2, 2016

(54) APPARATUS FOR REFERENCE VOLTAGE GENERATING CIRCUIT

(71) Applicant: STMicroelectronics International N.V., Amsterdam (NL)

(72) Inventors: Vinod Kumar, Pratapgarh (IN); SaiyidMohammadIrshad Rizvi, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 503 days.

(21) Appl. No.: 13/659,809

(22) Filed: Oct. 24, 2012

(65) Prior Publication Data

US 2014/0111010 A1  Apr. 24, 2014

(51) Int. Cl.
*G05F 1/577* (2006.01)
*G06F 1/32* (2006.01)

(52) U.S. Cl.
CPC .............. *G06F 1/329* (2013.01); *Y02B 60/144* (2013.01); *Y10T 307/406* (2015.04)

(58) Field of Classification Search
CPC ........... G06F 1/329; G05F 1/577; H03L 5/00; H03K 19/018528; H03K 19/003; H03K 19/00384
USPC ........................ 307/31; 327/77, 333
See application file for complete search history.

(56) References Cited

U.S. PATENT DOCUMENTS

| | | | | |
|---|---|---|---|---|
| 6,680,656 | B2 * | 1/2004 | Chen ............................ | 331/143 |
| 2001/0052784 | A1 * | 12/2001 | Sim et al. ..................... | 324/763 |
| 2002/0011873 | A1 * | 1/2002 | Riccio et al. .................. | 326/80 |
| 2008/0297132 | A1 * | 12/2008 | Aota ............................. | 323/313 |
| 2010/0220539 | A1 * | 9/2010 | Huang et al. ................. | 365/226 |
| 2011/0157249 | A1 * | 6/2011 | Park ............................. | 345/690 |
| 2011/0254591 | A1 * | 10/2011 | Monga .......................... | 326/80 |
| 2012/0256694 | A1 * | 10/2012 | Smith et al. .................. | 331/46 |

* cited by examiner

*Primary Examiner* — Jared Fureman
*Assistant Examiner* — James P Evans
(74) *Attorney, Agent, or Firm* — Slater & Matsil, L.L.P.

(57) ABSTRACT

An apparatus comprises a reference voltage bias generator configured to generate a first reference voltage and a second reference voltage. During a low supply mode, the first reference voltage is equal to a supply voltage potential and the second reference voltage is equal to a ground potential. During a high supply mode, the first reference voltage is equal to a first fraction times the supply voltage potential and the second reference voltage is equal to a second fraction times the supply voltage potential. The apparatus further includes a reference voltage booster coupled to the reference voltage bias generator, wherein the reference voltage booster is configured to generate the first reference voltage and the second reference voltage with increased drive capability.

20 Claims, 5 Drawing Sheets

APPARATUS FOR REFERENCE VOLTAGE GENERATING CIRCUIT

TECHNICAL FIELD

The present invention relates to an apparatus for reference voltage generating circuits, and, in particular embodiments, to a configurable reference voltage generating mechanism for input and output interface circuits having a wide supply voltage range.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices such central processing unit (CPU) has grown recently, there has grown a need for reducing the voltage rating of semiconductor devices fabricated on a shrinking process node.

As new CPU design and manufacturing technologies have been employed, new generation CPU devices are capable of steadily operating from a voltage as low as approximately 0.9V. Such a low supply voltage allows CPU devices to be fabricated in a 1.8V CMOS process. On the other hand, some peripheral devices such as input/output (I/O) interface devices still operate from a higher voltage supply (e.g., 3.3V). When a logic signal is forwarded from an I/O interface device to a CPU, the mismatch between the supply voltages of two devices may cause a reliability issue. More particularly, the logic signal having a high voltage (e.g., 3.3V) may exceed the maximum voltage (e.g., 1.8V) to which the CPU is specified.

Conventional voltage level shifting devices are employed to shift a voltage level up when a logic signal is forwarded from a CPU to an I/O device and shift a voltage level down when a logic signal is sent from an I/O device to a CPU. A variety of voltage level shifting devices have been adopted to convert an input voltage signal to an output voltage signal within a range suitable for a device operating from a different supply voltage.

SUMMARY OF THE INVENTION

These and other problems are generally solved or circumvented, and technical advantages are generally achieved, by preferred embodiments of the present invention which provide an apparatus for providing reference voltages for an input and output circuit.

In accordance with an embodiment, an apparatus comprises a reference voltage generator configured to generate a first reference voltage, wherein during a low supply mode, the first reference voltage is equal to a supply voltage potential and during a high supply mode, the first reference voltage is equal to a first fraction times the supply voltage potential.

The apparatus further comprises a second reference voltage, wherein during a low supply mode, the second reference voltage is equal to a ground potential, and during a high supply mode, the second reference voltage is equal to a second fraction times the supply voltage potential and a reference voltage booster coupled to the reference voltage generator, wherein the reference voltage booster is configured to generate the first reference voltage and the second reference voltage with increased drive capability.

In accordance with another embodiment, a device comprises a first voltage divider coupled between a supply voltage potential and a ground potential, wherein the first voltage divider comprises a plurality of first resistors and a first switch connected in series, a second voltage divider connected in parallel with the first voltage divider, wherein the second voltage divider comprises a plurality of second resistors and a second switch connected in series.

The device further comprises a first output stage including a first transistor and a second transistor connected in series, wherein a first reference voltage is coupled to a common node of the first transistor and the second transistor, a first amplifier coupled between the first voltage divider and the first output stage, a first bias circuit provide a first bias current for the first amplifier, a second output stage including a third transistor and a fourth transistor connected in series, wherein a second reference voltage is coupled to a common node of the third transistor and the fourth transistor, a second amplifier coupled between the second voltage divider and the second output stage and a second bias circuit provide a second bias current for the second amplifier.

In accordance with yet another embodiment, a system comprises a plurality of input and output buffers comprising a plurality of level shifters, a reference voltage generator configured to generate a first reference voltage and a second reference voltage for the level shifters, wherein the reference voltage generator is configured to operate in a low supply mode when a supply voltage of the reference voltage generator is less than a threshold voltage and operate in a high supply mode when the supply voltage of the reference voltage generator is greater than a threshold voltage and a reference voltage booster coupled between the level shifters and the reference voltage generator, wherein the reference voltage booster is configured to increase drive capability of the reference voltage generator.

An advantage of an embodiment of the present invention is providing reference voltages for an input and output system having a wide voltage range and improving the scalability of an input and output system having a plurality of I/O interface circuits.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present disclosure will be described with respect to embodiments in a specific context, a configurable reference voltage generating circuit for an input and output (I/O) interface circuit having a wide voltage range. The embodiments of the disclosure may also be applied, however, to a variety of reference generating circuits. Hereinafter, various embodiments will be explained in detail with reference to the accompanying drawings.

Figure 1:
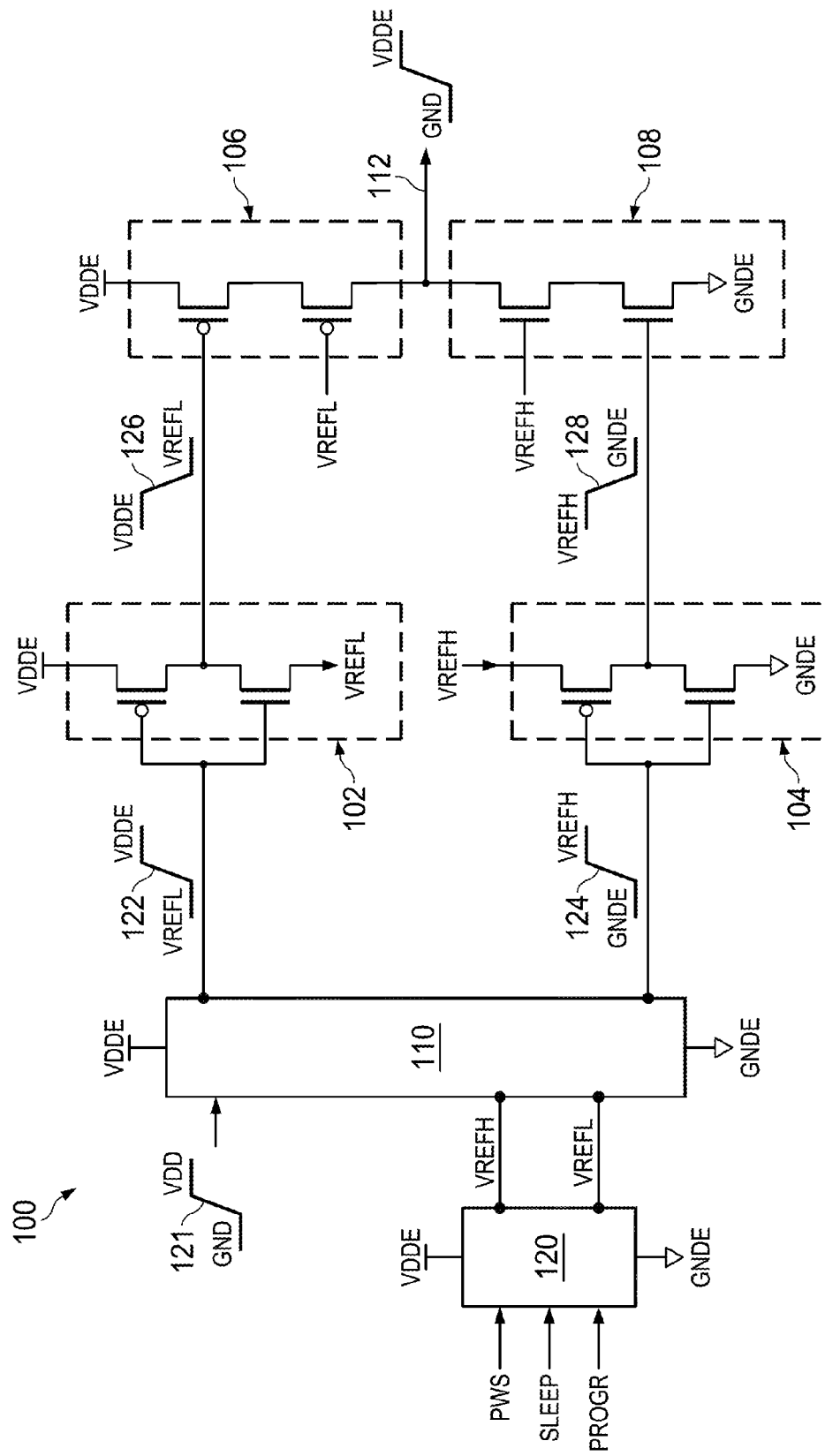
FIG. 1 illustrates a schematic diagram of an I/O interface circuit in accordance with an embodiment.

FIG. 1 illustrates a schematic diagram of an I/O interface circuit in accordance with an embodiment. The I/O interface circuit 100 may comprise a level shifter 110 coupled between a core device such as a CPU processor (not shown) and an input and output terminal 112. In accordance with an embodiment, the core device may operate in a first voltage range from 0.9V to 1.8V. On the other hand, the input and output terminal 112 may be of a voltage rating up to 3.3V. The level shifter 110 is employed to convert an input signal having a lower voltage rating (e.g., 1.8V) to an output signal having a higher voltage rating (e.g., 3.3V).

In order to generate the output signal having a higher voltage rating, the level shifter 110 receives two reference signals VREFH and VREFL from an internal reference voltage generator 120. As shown in FIG. 1, the internal reference voltage generator 120 is coupled between a first supply voltage VDDE and a first ground potential GNDE. Furthermore, the internal reference voltage generator 120 may receive three control signals, namely PWS, SLEEP and PROGR. The control signals may be generated by the core device or other suitable devices such as a system management unit (SMU).

In accordance with an embodiment, PWS is a control signal indicating the operation mode of the internal reference voltage generator 120. When the supply voltage VDDE is within the range of the core device's voltage rating such as (VDDE<=1.98V), the control signal PWS is in a logic low state. Such a logic low state allows the internal reference voltage generator 120 operating in a low supply mode.

In contrast, when the supply voltage VDDE is beyond the range of the core device's voltage rating such as (1.98V<VDDE<=3.6V), the control signal PWS is in a logic high state. Such a logic high state allows the internal reference voltage generator 120 operating in a high supply mode. The detailed operation of the high and low supply modes of the internal reference voltage generator 120 will be described below with respect to FIG. 4.

The control signal PROGR is used to set the values of the reference voltages (e.g., VREFH and VREFL) when the internal reference voltage generator 120 operates in a high supply mode. The detailed operation of the control signal PROGR will be described below with respect to FIG. 4.

The control signal SLEEP is used to indicate the data transmission status of the I/O interface circuit 100. When there is no data transmitted in the I/O interface circuit 100, the control signal SLEEP reduces the bias current of the internal reference generator 120 so as to reduce power consumption. On the contrary, when the I/O interface circuit 100 operates in normal mode, the bias current of the internal reference generator 120 returns to its normal value so that the performance of the I/O interface circuit such as the settling time of the reference voltages can be reduced.

As shown in FIG. 1, the internal reference voltage generator 120 may provide two reference signals VREFH and VREFL for the level shifter 110. In accordance with an embodiment, reference signal VREFH is used as a sourcing terminal for the I/O interface circuit 100. Reference signal VREFL is used as a sinking terminal for the I/O interface circuit 100. In comparison with conventional I/O interface circuits having a single reference, the dual reference configuration shown in FIG. 1 helps to reduce the voltage variation during the transition of different logic states, while keeping low static power consumption. The detailed operation principles of these two reference voltage signals will be described below with respect to FIG. 3 and FIG. 4.

FIG. 1 further illustrates an output stage coupled between the outputs of the level shifter 110 and the input and output terminal 112. The output stage is formed by four pairs of transistors, namely a first pair of transistors 102, a second pair transistors 104, a third pair of transistors 106 and a fourth pair of transistors 108. As shown in FIG. 1, the first pair of transistors 102 may include a p-channel transistor and an n-channel transistor connected in series and coupled between the supply voltage VDDE and the sinking terminal VREFL. The input of the first pair of transistors 102 is coupled to a first output 122 of the level shifter 110. The first output 122 of the level shifter 110 may be a signal having two voltage levels, VREFL and VDDE. The first pair of transistors 102 may function as an inverter converting the input signal from the level shifter 110 into an inverted signal 126. The structure of the second pair of transistors 104 is similar to that of the first pair of transistors 102, and hence is not discussed in further detail herein.

The third pair of transistors 106 and the fourth pair of transistor 108 are formed by two p-channel transistors and two n-channel transistors respectively. As shown in FIG. 1, the third pair of transistors 106 and the fourth pair of transistors 108 are connected in series and further coupled between the supply voltage VDDE and the ground potential GNDE. The third pair of transistors 106 and the fourth pair of transistors 108 form another inverter coupled to the outputs 126 and 128. The inverter converts the inverted signals at the outputs of the first pair of transistors (signal 126) and the second pair of transistor (signal 128) into a signal in phase with the input signal 121.

In sum, the level shifter 110 generates two output signals (e.g., signals 122 and 124) having different voltage levels (VREFL, VDDE for output 122 and GNDE, VREFH for output 124) in response to the input signal 121 having a voltage swing from GND to VDD. The two output signals 122 and 124 are in phase with the input signal 121 of the level shifter 110, but having a different voltage rating. The output stage coupled between the output terminal 112 and the level shifter 110 converts the two output signals 122 and 124 into a single output signal 112 having the same logic state as the input signal 121, but having different voltage ratings. In particular, the input signal 121 is in a range from GND to VDD, wherein VDD is the core supply voltage. In contrast, the output signal 112 is in a range from GNDE to VDDE, wherein VDDE is the I/O supply voltage.

Figure 2:
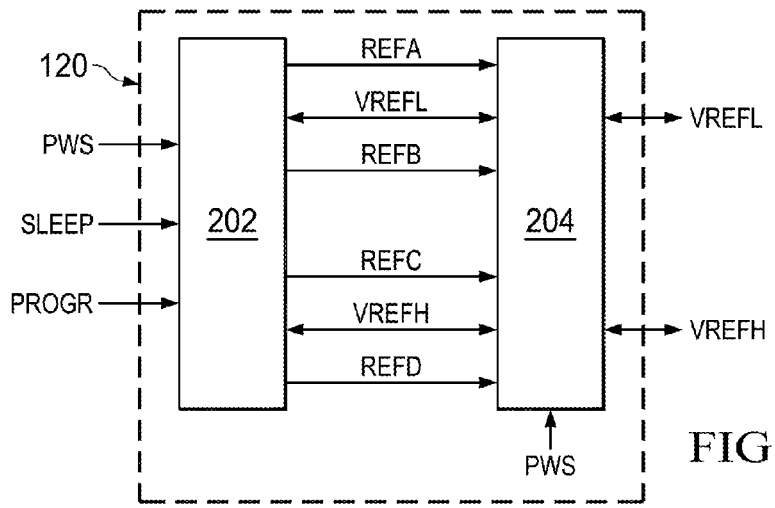
FIG. 2 illustrates a block diagram of the internal reference voltage generator shown in FIG. 1 in accordance with an embodiment.

FIG. 2 illustrates a block diagram of the internal reference voltage generator shown in FIG. 1 in accordance with an embodiment. The internal reference voltage generator 120 may comprise a reference voltage bias generator 202 and a reference voltage booster 204. As shown in FIG. 2, there may be six signals coupled between the reference voltage bias generator 202 and the reference voltage booster 204. The reference voltage booster 204 generates the two output signals VREFL and VREFH based upon the input bias signals REFA, REFB, REFC, REFD.

As shown in FIG. 2, the reference voltage bias generator 202 receives three control signals PWS, SLEEP and PROGR from a core device or other suitable system management units. The reference voltage bias generator 202 generates two main reference signals VREFL and VREFH based upon the need of various applications. In addition, the reference voltage bias generator 202 may generate four auxiliary bias signals (e.g., REFA, REFB, REFC and REFD), which are used to increase the drive capability of the main reference signals VREFL and VREFH through the reference voltage booster 204. The detailed schematic diagrams and operation principles of the reference voltage bias generator 202 and the reference voltage booster 204 will be described below with respect to FIG. 3 and FIG. 5 respectively.

Figure 3:
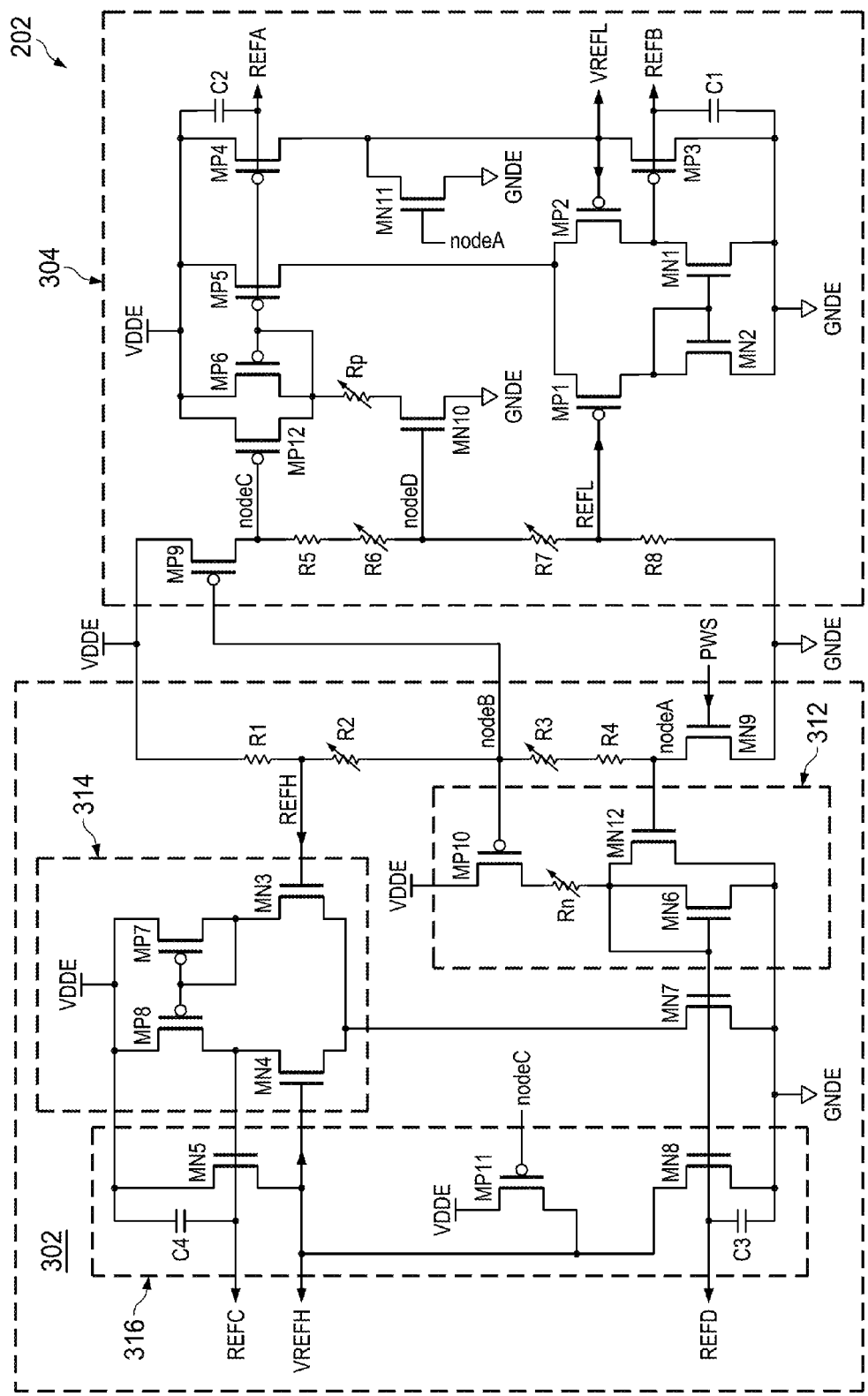
FIG. 3 illustrates a schematic diagram of the reference voltage bias generator shown in FIG. 2 in accordance with an embodiment.

FIG. 3 illustrates a schematic diagram of the reference voltage bias generator shown in FIG. 2 in accordance with an embodiment. The reference voltage bias generator 202 may be divided into two portions, namely a first portion 302 and a second portion 304. The first portion 302 is employed to generate the main reference voltage VREFH and two auxiliary bias voltage signals REFC and REFD. Likewise, the second portion 304 is similar to the first portion 302. The second portion 304 is employed to generate the main reference voltage VREFL and another two auxiliary bias voltage signals REFA and REFB.

The first portion 302 includes a voltage divider circuit formed by R1, R2, R3 and R4 connected in series. The voltage divider circuit is coupled between VDDE and GNDE through a switch MN9. In accordance with an embodiment, R1 and R4 are fixed resistors; R2 and R3 are adjustable resistors. The switch MN9 is formed by an n-channel transistor having a gate coupled to the control signal PWS. The voltage divider circuit is used to provide a reference voltage signal REFH, which is the voltage at the common node between R1 and R2. By adjusting the resistance values of R2 and R3, the voltage level of the reference voltage signal REFH may change accordingly.

The first portion 302 further includes a self-bias circuit 312 for driving an amplifier 314. The self-bias circuit 312 is formed by two transistors MP10 and MN6, and an adjustable resistor Rn. The self-bias circuit 312 provides a bias current for the amplifier 314. The detailed operation principle of the self-bias circuit 312 is well known, and hence is not discussed herein to avoid unnecessary repetition.

It should be noted that the self-bias circuit 312 is slightly different from a conventional self-bias circuit because the adjustable resistor Rn is capable of providing different bias currents depending on different operating conditions. Referring back to FIG. 1, the control signal SLEEP is used to indicate the operating conditions (e.g., normal mode or idle mode). During normal operation, the adjustable resistor Rn may be adjusted to a low value so as to increase the bias current to a higher level. Such a higher bias current level helps to reduce the settling time of the reference signals during a data transition period of the I/O interface circuit. On the other hand, during an idle period of the I/O interface circuit, the adjustable resistor Rn is set to a higher value. As a result, the bias current of the amplifier 314 is reduced. Such a reduced bias current helps to reduce power consumption.

The amplifier 314 is formed by five transistors, namely MP8, MP7, MN4, MN3 and MN7. In accordance with an embodiment, MP8 and MP7 are p-channel transistors. MN3, MN4 and MN7 are n-channel transistors. According to the operation principles of amplifiers, the voltage REFH at the gate of MN3 is the same as the voltage VREFH at the gate of MN4. As shown in FIG. 3, the value of the voltage REFH is determined by the voltage divider coupled between VDDE and GNDE. As such, the voltage VREFH is determined by the voltage divider too. In particular, the value selection of adjustable resistors R2 and R3 determines the value of the first main reference voltage VREFH. The detailed operation principle of amplifiers is well known, and hence is not discussed herein.

The first portion 302 further includes an output stage 316. The output stage 316 is formed by three transistors, namely MN5, MP11 and MN8. As shown in FIG. 3, MN5 and MN8 are connected in series and further coupled between VDDE and GNDE. The output stage 316 formed by MN5 and MN8 is similar to a conventional output stage, which is well known, and hence is not discussed herein.

It should be noted that the output stage 316 further includes a transistor MP11, which is coupled between VDDE and the common node between MN5 and MN8. Furthermore, the gate of MP11 is coupled to an internal control signal nodeC. The internal control signal nodeC is used to activate the MP11 and clamp the reference VREFH to the supply voltage VDDE when the reference voltage bias generator 202 operates in a low supply mode. The detailed description of the low supply mode as well as its counterpart high supply mode will be given below with respect to FIG. 4.

The second portion 304 is of a similar structure as the first portion 302. After reading the description of the first portion 302, a person skilled in the art will understand the functions and operating principles of the second portion 304. Therefore, the functions and operation principles of the second portion 304 are not discussed again herein to avoid unnecessary repetition.

Figure 4:
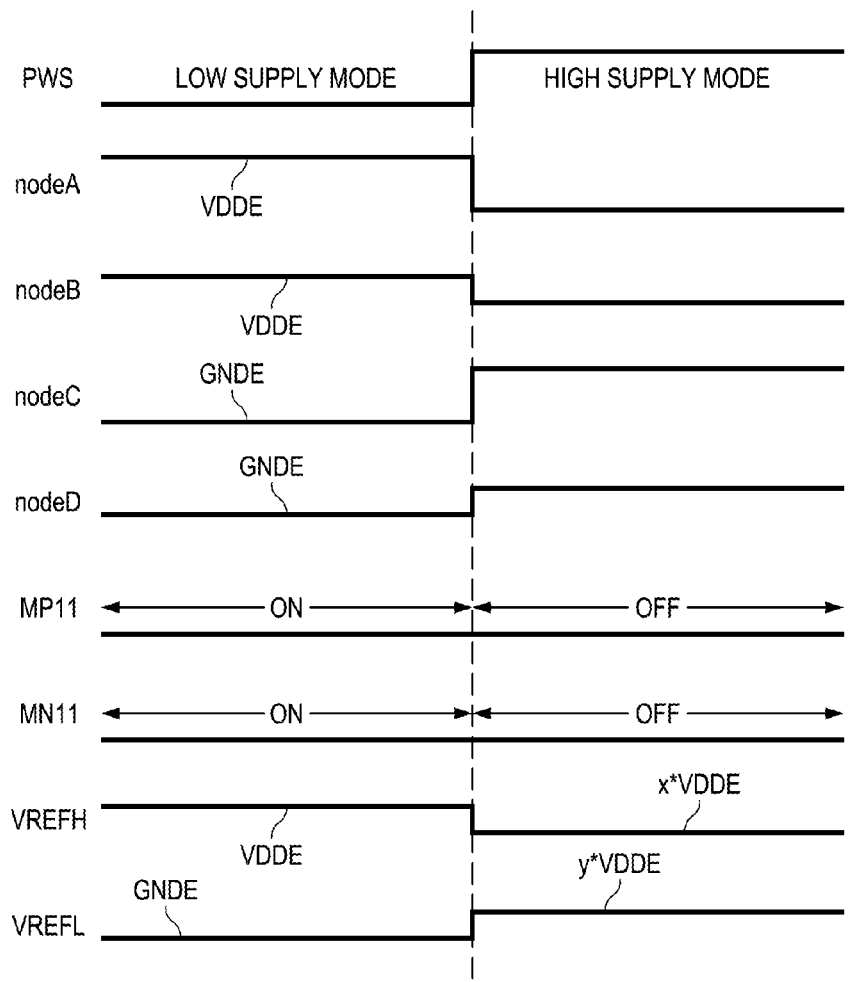
FIG. 4 illustrates two operation modes of the I/O interface circuit in accordance with an embodiment.

FIG. 4 illustrates two operation modes of the I/O interface circuit in accordance with an embodiment. As shown in FIG. 4, the reference voltage bias generator 202 enters a low supply mode when the control signal PWS is in a logic low state. Referring back to FIG. 3, the transistor MN9 is turned off when the control signal PWS is low. As a result, the voltages at nodeA and nodeB stay at a voltage level equal to VDDE. The high voltage at nodeB keeps the transistor MP9 off. The turned-off transistor MP9 makes the voltage potentials at nodeC and node B equal to GNDE.

As shown in FIG. 3, nodeC and nodeA are coupled to the gates of MP11 and MN11 respectively. The low voltage at nodeC and the high voltage at nodeA turn on the transistors MP11 and MN11 respectively. As a result, the reference VREFH is connected to VDDE and the reference VREFL is connected to GNDE. In sum, when the reference voltage bias generator 202 operates in a low supply mode, the reference voltages VREFH and VREFL are set to VDDE and GNDE respectively.

Likewise, the reference voltage bias generator 202 enters a high supply mode when the control signal PWS is in a logic high state. Referring back to FIG. 3, the transistor MN9 is turned on when the control signal PWS is high. As a result, the voltage at nodeA is equal to GNDE. The voltage at nodeB is determined by the following equation:

$$V_{nodeB} = VDDE \cdot \frac{R3 + R4}{R1 + R2 + R3 + R4}$$

Likewise, the voltage at REFH is determined by the following equation:

$$REFH = VDDE \cdot \frac{R2 + R3 + R4}{R1 + R2 + R3 + R4}$$

The equation above can be simplified as follows: REFH is equal to x times VDDE, wherein x is approximately equal to 0.55 for a 3.3V VDDE application in accordance with an embodiment. It should be noted that in response to different applications and supply voltages, through the control signal PROGR, the value of x can be adjusted by changing the resistance values of the adjustable resistors R2, R3 or any combination thereof. Referring back to FIG. 2, the control signal PROGR coupled to the reference voltage bias generator 120 is used to adjust the values of R2 and R3 in response to different applications or supply voltages.

Referring back to FIG. 3, during a high supply mode, the voltage at nodeB is lower than VDDE. Such a lower voltage at nodeB keeps the transistor MP9 on. The turned-on transistor MP9 makes the voltage potential at nodeC equal to VDDE. The voltage at nodeD is determined by the following equation:

$$V_{nodeD} = VDDE \cdot \frac{R7 + R8}{R5 + R6 + R7 + R8}$$

Likewise, the voltage at REFL is determined by the following equation:

$$REFL = VDDE \cdot \frac{R8}{R5 + R6 + R7 + R8}$$

The equation above can be simplified as follows: REFL is equal to y times VDDE, wherein y is approximately equal to 0.45 for a 3.3V VDDE application in accordance with an embodiment. It should be noted that in response to different applications and supply voltages, through the control signal PROGR, the value of y can be adjusted by changing the resistance values of the adjustable resistors R6, R7 or any combination thereof.

Referring back to FIG. 3, nodeC and nodeA are coupled to the gates of MP11 and MN11 respectively. The high voltage at nodeC and the low voltage at nodeA turn off MP11 and MN11 respectively. As a result, MP11 and MP11 have no impact on the output reference voltages when the reference voltage bias generator 202 operates in a high supply mode. According to the operating principles of amplifiers, the output references VREFH and VREFL are equal to REFH and REFL respectively. In sum, when the reference voltage bias generator 202 operates in a high supply mode, the reference voltages VREFH and VREFL are set to x times VDDE and y times VDDE respectively.

One advantageous feature of having a high supply mode shown in FIG. 4 is that a signal skew between a sourcing terminal (e.g., VREFH=0.55 VDDE) and a sinking terminal (e.g., VREFL=0.45 VDDE) helps to improve the performance such as the speed of I/O interface circuits. In addition, the control signal PROGR can help to further improve the performance of the I/O interface circuits by adjusting the signal skew based upon different supply voltages and applications.

Figure 5:
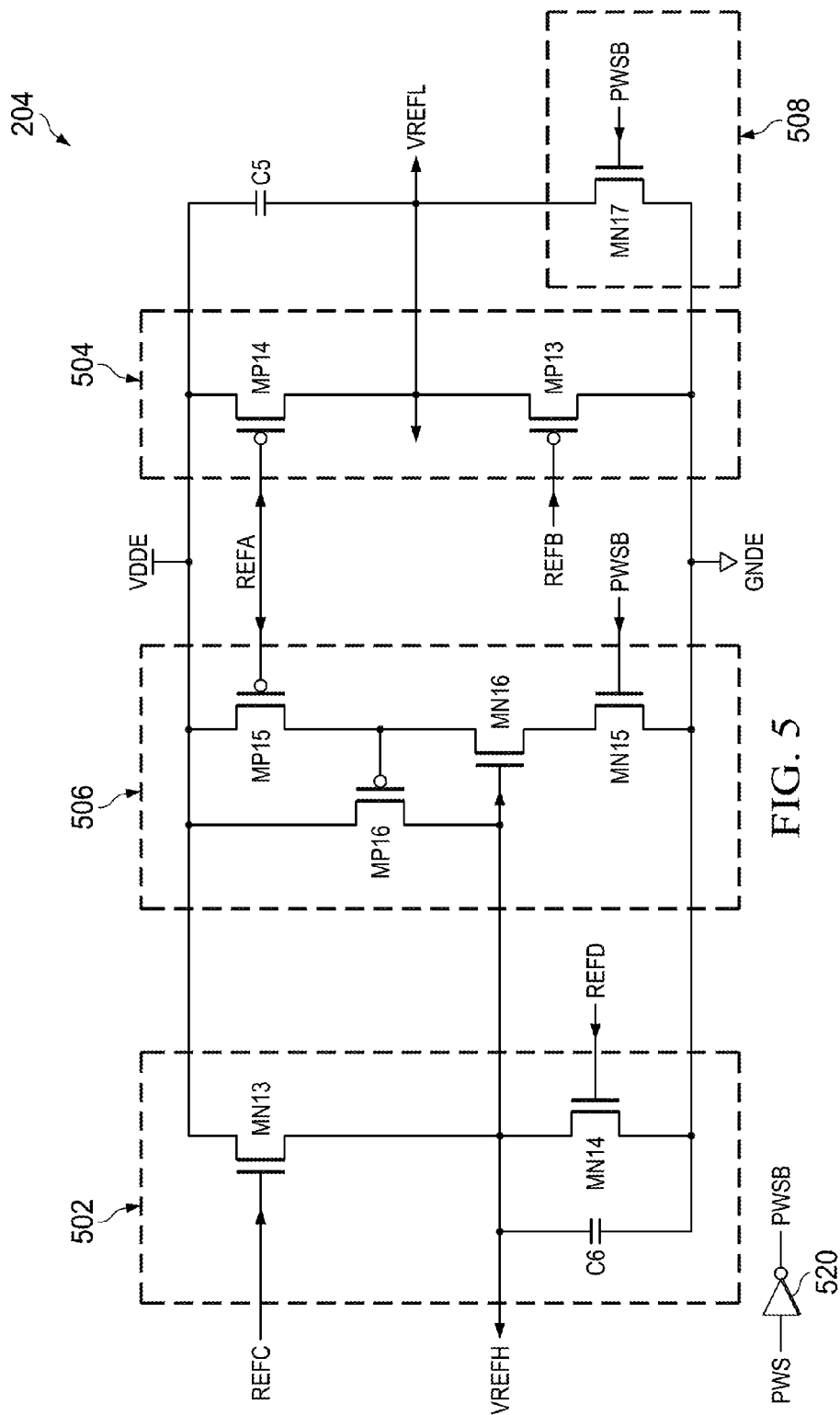
FIG. 5 illustrates a schematic diagram of the reference voltage booster shown in FIG. 2 in accordance with an embodiment.

FIG. 5 illustrates a schematic diagram of the reference voltage booster shown in FIG. 2 in accordance with an embodiment. The reference voltage booster 204 is coupled to the reference voltage bias generator 202. The reference voltage booster 204 is used to increase load handling capability. In particular, when a plurality of I/O circuits are coupled to a reference voltage bias generator, the drive capability of a single reference voltage bias generator may be not enough to drive a large number of I/O circuits. In order to maintain a high quality reference voltage for a large number of I/O circuits, reference voltage boosters are employed to increase the drive capability of the reference voltages.

The reference voltage booster 204 includes two output stages, namely a first output stage 502 and a second output stage 504. The first output stage 502 is formed by MN13 and MN14 connected in series. Referring back to FIG. 3, the first output stage 502 is of the same structure as the output stage 316. Likewise, the second output stage 504 is of the same structure as the output stage of the reference voltage VREFL. The reference voltage booster 204 further includes two logic units, namely a first logic unit 506 and a second logic unit 508. The logic unit 506 and the logic unit 508 are used to keep the reference voltage booster 204 operating in a low supply mode when the control signal PWS is logic low and in a high supply mode when the control signal PWS is logic high.

When PWS is in a logic low state, the control signal is in logic high stage because there is an inverter 520 coupled between PWS and PWSB. As shown in FIG. 5, PWSB is applied to the gate of MN15. MN15 is turned on as a result. The turned-on MN15 and the high voltage (VREFH) at gate MN16 lead to the turn-on of MN16. The turned-on MN16 and MN15 lead to a low voltage applied to the gate of MP16. As a p-channel transistor, MP16 turns on after receiving a low voltage at its gate. The turned-on MP16 connects the reference voltage VREFH to VDDE. Likewise, the turned on MN17 helps to clamp the reference voltage VREFL to GNDE. In sum, in a low supply mode, the logic units 506 and 508 keep the output voltages of the reference voltage booster 204 matching the output voltages from the reference voltage bias generator 202.

Figure 6:
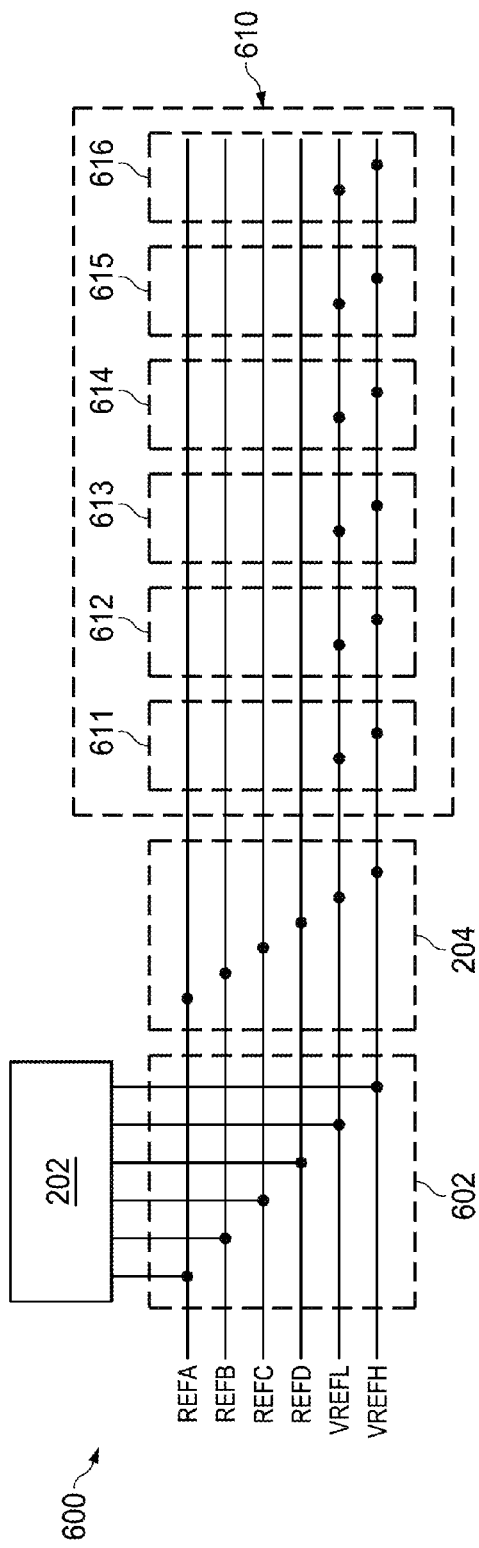
FIG. 6 illustrates a block diagram of an I/O interface system in accordance with an embodiment.

FIG. 6 illustrates a block diagram of an I/O interface system in accordance with an embodiment. The I/O interface system 600 may include an I/O interface group 610, a reference voltage booster 204, a filler circuit 602 and a reference voltage bias generator 202. In accordance with an embodiment, the I/O interface group 610 may include six I/O interface circuits, namely a first I/O interface circuit 611, a second I/O interface circuit 612, a third I/O interface circuit 613, a fourth I/O interface circuit 614, a fifth I/O interface circuit 615 and a sixth I/O interface circuit 616.

As shown in FIG. 6, the reference voltage bias generator 202 generates six reference voltages, REFA, REFB, REFC, REFD, VREFL and VREFH respectively. To save the I/O ring area, the reference voltage bias generator circuit may be placed in a core region. The filler circuit 602 is used to connect the reference voltages REFA, REFB, REFC, REFD, VREFL and VREFH generated in the core region to the reference rails in the I/O rail region. The reference voltage booster 204 is employed to increase the drive capability of the reference voltages VREFH and VREFL generated by the reference voltage bias generator 202.

One advantageous feature of having the system configuration shown in FIG. 6 is that the system is of good scalability. In other words, when additional input and output interface circuits are added into the system, it is not necessary to redesign the reference voltage bias generator 202. Instead, the drive capability can be improved by reconfiguring the system. In particular, additional reference voltage boosters (e.g., reference voltage booster 204) may be employed to accommodate the increased number of input and output interface circuits. The detailed implementation will be described below with respect to FIG. 7.

Figure 7:
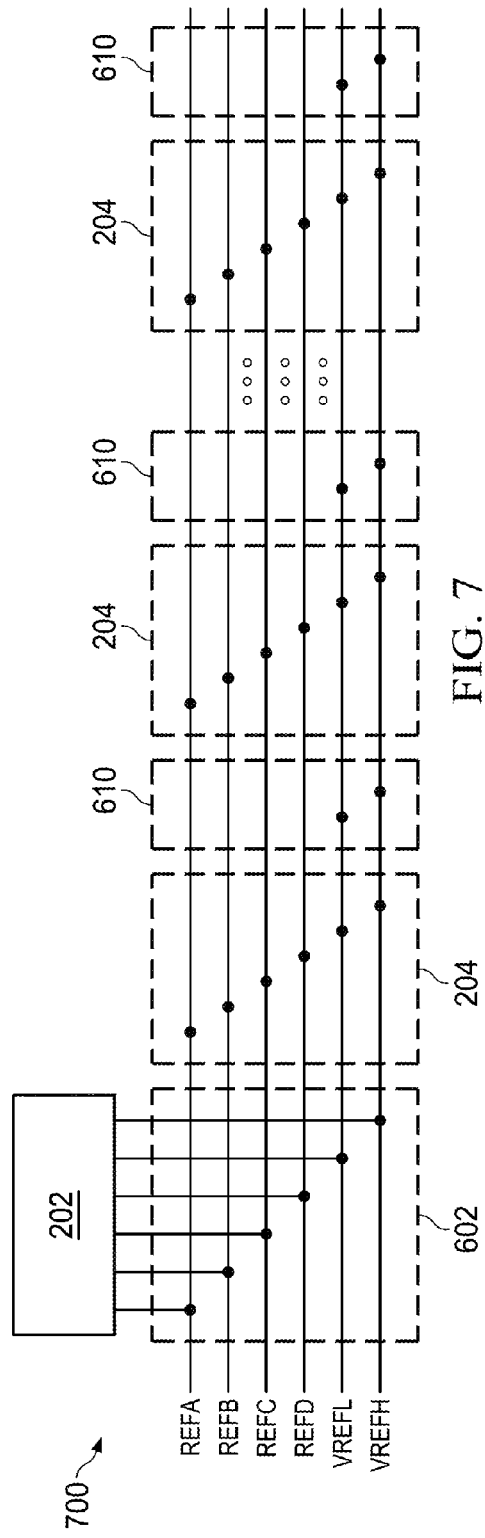
FIG. 7 illustrates a block diagram of an input and output interface system in accordance with another embodiment.

FIG. 7 illustrates a block diagram of an input and output interface system in accordance with another embodiment. The input and output interface system 700 may comprise a plurality of input and output interface groups 610. In order to accommodate the increased number of input and output interface groups, a plurality of reference voltage boosters are placed next to their corresponding input and output interface group. As such, the drive capability of the reference voltages VREFL and VREFH is maintained without redesigning the reference voltage bias generator 202.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
a reference voltage bias generator coupled to an external device having a maximum voltage rating and to an external voltage source having a supply voltage potential; and
a reference voltage current booster coupled to the reference voltage bias generator, wherein
the reference voltage bias generator is configured to operate in a low supply mode when the supply voltage potential is not greater than the maximum voltage rating,
the reference voltage bias generator is configured to operate in a high supply mode when the supply voltage potential is greater than the maximum voltage rating,
the reference voltage bias generator is configured to generate:
a first reference voltage, wherein during the low supply mode, the first reference voltage is equal to the supply voltage potential and during the high supply mode, the first reference voltage is equal to a first fraction times the supply voltage potential; and
a second reference voltage, wherein during the low supply mode, the second reference voltage is equal to a ground potential, and during the high supply mode, the second reference voltage is equal to a second fraction times the supply voltage potential, and
the reference voltage current booster is configured to generate the first reference voltage and the second reference voltage with increased drive capability when a plurality of input and output interface circuits are coupled to the reference voltage bias generator.

2. The apparatus of claim 1, further comprising:
a first output stage coupled between the supply voltage potential and the ground potential, wherein the first output stage comprises a first transistor and a second transistor connected in series and the first reference voltage is generated at a common node between the first transistor and the second transistor.

3. The apparatus of claim 2, further comprising:
a third reference voltage generated at a common node between a gate of the first transistor and the reference voltage booster; and
a fourth reference voltage generated at a common node between a gate of the second transistor and the reference voltage booster.

4. The apparatus of claim 2, wherein the reference voltage bias generator comprises:
a first voltage divider formed by a plurality of first resistors, wherein the first voltage divider is configured to set a first reference voltage signal for the first reference voltage;
a first amplifier coupled between the first voltage divider and the first output stage; and
a first bias circuit coupled to the first amplifier.

5. The apparatus of claim 1, further comprising:
a second output stage coupled between the supply voltage potential and the ground potential, wherein the second output stage comprises a third transistor and a fourth transistor connected in series and the second reference voltage is generated at a common node between the third transistor and the fourth transistor.

6. The apparatus of claim 5, further comprising:
a fifth reference voltage generated at a common node between a gate of the third transistor and the reference voltage current booster; and
a sixth reference voltage generated at a common node between a gate of the fourth transistor and the reference voltage current booster.

7. The apparatus of claim 5, wherein the reference voltage bias generator comprises:
a second voltage divider formed by a plurality of second resistors, wherein the second voltage divider is configured to set a second reference voltage signal for the second reference voltage;
a second amplifier coupled between the second voltage divider and the second output stage; and
a second bias circuit coupled to the second amplifier.

8. The apparatus of claim 1, wherein:
the first fraction is approximately equal to 0.55 for applications using a 3.3V supply voltage.

9. The apparatus of claim 1, wherein:
the second fraction is approximately equal to 0.45 for applications using a 3.3V supply voltage.

10. A device comprising:

a first voltage divider coupled between a supply voltage potential and a ground potential, wherein the first voltage divider comprises a plurality of first resistors and a first switch connected in series;

a second voltage divider connected in parallel with the first voltage divider, wherein the second voltage divider comprises a plurality of second resistors and a second switch connected in series;

a first output stage including a first transistor and a second transistor connected in series, wherein a first reference voltage is generated at a common node of the first transistor and the second transistor;

a first amplifier coupled between the first voltage divider and the first output stage;

a first bias circuit configured to provide a first bias current for the first amplifier;

a second output stage including a third transistor and a fourth transistor connected in series, wherein a second reference voltage is generated at a common node of the third transistor and the fourth transistor;

a second amplifier coupled between the second voltage divider and the second output stage; and a second bias circuit configured to provide a second bias current for the second amplifier.

11. The device of claim 10, further comprising a reference voltage booster, wherein the reference voltage booster includes:

a third output stage coupled to the first output stage, wherein the third output stage and the first output stage are of a similar structure;

a fourth output stage coupled to the second output stage, wherein the fourth output stage and the second output stage are of a similar structure;

a first logic unit coupled to the third output stage, wherein the first logic unit is configured to make an output of the third output stage equal to an output of the first output stage; and a second logic unit coupled to the fourth output stage, wherein the second logic unit is configured to make an output of the fourth output stage equal to an output of the second output stage.

12. The device of claim 10, wherein the first bias circuit comprises a first adjustable resistor for adjusting the first bias current.

13. The device of claim 10, wherein the second bias circuit comprises a second adjustable resistor for adjusting the second bias current.

14. The device of claim 10, wherein the device is coupled to an external device having a maximum voltage rating and to an external voltage source having a supply voltage potential, and the first switch and the second switch are configured such that:

the first switch and the second switch are turned off when the supply voltage potential is not greater than the maximum voltage rating;

the first switch and the second switch are turned on when the supply voltage potential is greater than the maximum voltage rating;

a low supply mode occurs when the first switch and the second switch are turned off; and a high supply mode occurs when the first switch and the second switch are turned on.

15. The device of claim 10, wherein a third reference voltage is generated at a gate of the first transistor, and a fourth reference voltage is generated at a gate of the second transistor.

16. A device comprising:

a first reference voltage, a second reference voltage, a third reference voltage, and a fourth reference voltage;

a first output stage coupled between a supply voltage potential and a ground potential, the first output stage comprising a first transistor and a second transistor connected in series; and a second output stage coupled between the supply voltage potential and the ground potential, the second output stage comprising a third transistor and a fourth transistor connected in series, wherein the first reference voltage is generated at a common node between the first transistor and the second transistor, the second reference voltage is generated at a common node between the third transistor and the fourth transistor, the third reference voltage is generated at a gate of the first transistor, the fourth reference voltage is generated at a gate of the second transistor, during a low supply mode, the first reference voltage is equal to the supply voltage potential and the second reference voltage is equal to the ground potential, and during a high supply mode, the first reference voltage is equal to a first fraction times the supply voltage potential and the second reference voltage is equal to a second fraction times the supply voltage potential.

17. The device of claim 16, further comprising:

a first voltage divider formed by a plurality of first resistors, wherein the first voltage divider is configured to set a first reference voltage signal for the first reference voltage;

a first amplifier coupled between the first voltage divider and the first output stage; and a first bias circuit coupled to the first amplifier.

18. The device of claim 16, further comprising:

a fifth reference voltage generated at a gate of the third transistor; and a sixth reference voltage generated at a gate of the fourth transistor.

19. The device of claim 16, further comprising:

a second voltage divider formed by a plurality of second resistors, wherein the second voltage divider is configured to set a second reference voltage signal for the second reference voltage;

a second amplifier coupled between the second voltage divider and the second output stage; and a second bias circuit coupled to the second amplifier.

20. The device of claim 16, wherein:

the first fraction is approximately equal to 0.55 for applications using a 3.3V supply voltage; and the second fraction is approximately equal to 0.45 for applications using a 3.3V supply voltage.

* * * * *